United States Patent
Chen

(10) Patent No.: US 7,804,326 B1
(45) Date of Patent: Sep. 28, 2010

(54) VOLTAGE LEVEL SHIFTER

(75) Inventor: Chung-Zen Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 12/627,107

(22) Filed: Nov. 30, 2009

(51) Int. Cl.
*H03K 19/0175* (2006.01)

(52) U.S. Cl. .......................................... 326/68; 326/81

(58) Field of Classification Search .................. 326/62, 326/63, 68, 80–83
See application file for complete search history.

(56) References Cited

U.S. PATENT DOCUMENTS

| | | | |
|---|---|---|---|
| 6,385,099 B1 | 5/2002 | Taub | |
| 6,504,421 B2 | 1/2003 | Blodgett et al. | |
| 7,362,158 B2 | 4/2008 | Park et al. | |
| 7,463,065 B1 * | 12/2008 | Lin et al. | 326/68 |
| 7,667,521 B2 * | 2/2010 | Lee | 327/333 |

* cited by examiner

*Primary Examiner*—Don P Le
(74) *Attorney, Agent, or Firm*—WPAT, P.C.; Anthony King

(57) ABSTRACT

A voltage level shifter comprises a voltage adjustment circuit, an inverter, a first NMOS transistor, a second NMOS transistor, a first PMOS transistor, and a second NMOS transistor. The voltage adjustment circuit is configured for receiving a first voltage and a second voltage and for generating an adjustment voltage. When the first voltage is higher than the second voltage, the adjustment voltage is substantially equal to the first voltage, and when the first voltage is lower than the second voltage, the adjustment voltage is substantially equal to the second voltage.

18 Claims, 6 Drawing Sheets

VOLTAGE LEVEL SHIFTER

BACKGROUND OF THE INVENTION

1. Field of the Invention

The present invention relates to a voltage level shifter, and more particularly, to a voltage level shifter operated at an adjustment voltage.

2. Description of the Related Art

In recent years, memory devices are being applied to a variety of fields such as personal computers, portable terminals, IC cards, etc., and further development continues rapidly. The memory device includes any suitable type of random access memory (RAM), such as dynamic RAM (DRAM), static RAM (SRAM), and pseudo static RAM (PSRAM). FIG. 1 shows a portion of a conventional memory device 10. The memory device 10 comprises a memory cell array 16 for storing data, wherein the memory cell array 16 comprises a plurality of memory cells 162. Referring to FIG. 1, each memory cell 162 comprises one or more memory elements in a region where word lines WL0, WL1, ..., WLn cross bit lines BL. In a DRAM, each memory cell 162 comprises a transistor, which controls writing or reading data with respect to a capacitor according to a word line signal.

The memory device 10 further comprises a row decoder 12, a charge pump 18, and a word line driver 14. The charge pump 18 is configured for receiving a low supply voltage VL and for generating a boosted voltage VH. The row decoder 12 is configured for receiving an address (ADRS) signal and for generating a plurality of output signals to the word line driver 14. The word line driver 14 comprises a level shifter 142 and a driver 146. During a write operation, the level shifter 142 converts the output signal of the row decoder 12 into a signal at the level of the voltage VH, and the driver 146 applies the voltage VH to the corresponding word lines WL0, WL1, ..., WLn.

FIG. 2 shows a block diagram of a high level shifter 20 disclosed in U.S. Pat. No. 7,362,158. The level shifter 20 includes a first transistor 21, a second transistor 22, a third transistor 23, a fourth transistor 24 and an inverter 25. The level shifter 20 receives an input signal $V_{in}$ which has two voltage levels $V_{CC}$ and GND, and generates an output signal $V_{out}$ which has two voltage levels $V_{DD}$ and GND, where $V_{DD} > V_{CC}$. When the input signal $V_{in} = V_{CC}$, the fourth transistor 24 is turned on, pulling a voltage at node $N_1$ low, and then the first transistor 21 is turned on. When the first transistor 21 is turned on, a voltage at node $N_2$ increases so that the voltage at node $N_1$ decreases rapidly. Subsequently, the output signal $V_{out}$ increases to a high level that is substantially equal to the voltage $V_{DD}$. However, the architecture in FIG. 2 suffers from a deficiency in that the voltage $V_{DD}$ is controlled by the charge pump 18 as shown in FIG. 1. Therefore, when the input signal $V_{in} = V_{CC}$ and the voltage $V_{DD}$ is ramped up from GND to $V_{CC}-V_{th}$ via the charge pump 18, where $V_{th}$ is a threshold voltage of the first transistor 21, a parasitic PN junction between the P+ drain and N-well of the first transistor 21 may turn on. As a result, the voltage $V_{DD}$ may not be increased. To solve the above deficiency, a fifth transistor (not shown), whose gate is connected to the voltage $V_{DD}$, is needed between the drain of the first transistor 21 and the drain of the second transistor 22, resulting in a significant increase in chip area.

FIG. 3 shows a block diagram of a conventional low-level shifter 30. The level shifter 30 includes a first transistor 31, a second transistor 32, a third transistor 33, a fourth transistor 34 and an inverter 35. The level shifter 30 receives an input signal $V_{in}$ which has two voltage levels $V_H$ and GND, and generates an output signal $V_{out}$ which has two voltage levels $V_{CC}$ and GND, where $V_H > V_{CC}$. The level shifter 30 suffers from a deficiency in that the input signal $V_{in} < V_{CC}-V_{th}$. In this case, the first transistor 31 is turned on. The second transistor 32 is turned on because $V_{in} > 0$, and thus the fourth transistor 34 is turned on. Since the first and fourth transistors 31 and 34 are turned on at the same time, a short current is produced, pulling the voltage $V_{CC}$ down, approximately close to GND. Because the voltage $V_H$ is generated according to the voltage $V_{CC}$, the voltage $V_H$ may not be increased.

Accordingly, there is a need to provide a level shifter which can overcome the previously described deficiencies.

SUMMARY OF THE INVENTION

The objective of the present invention is to provide a circuit for reducing power consumption and chip area.

According to one embodiment of the present invention, a voltage level shifter comprises a voltage adjustment circuit, an inverter, a first NMOS transistor, a second NMOS transistor, a first PMOS transistor, and a second NMOS transistor. The voltage adjustment circuit is configured for receiving a first voltage and a second voltage and for generating an adjustment voltage. When the first voltage is higher than the second voltage, the adjustment voltage is substantially equal to the first voltage, and when the first voltage is lower than the second voltage, the adjustment voltage is substantially equal to the second voltage.

The voltage level shifter comprises the inverter configured for receiving an input signal and for operating at the first voltage. The voltage level shifter comprises the first NMOS transistor having a gate connected to an output terminal of the inverter, a drain connected to an output signal, and a source connected to a reference voltage. The voltage level shifter comprises the second NMOS transistor having a gate connected to the first voltage, and a source connected to the output terminal of the inverter. The voltage level shifter comprises the first PMOS transistor having a gate connected to the output signal, a drain connected to a drain of the second NMOS transistor, and a source connected to the adjustment voltage. The voltage level shifter comprises the second PMOS transistor having a gate connected to the drain of the second NMOS transistor, a drain connected to the output signal, and a source connected to the adjustment voltage.

According to another embodiment of the present invention, a voltage level shifter comprises a voltage adjustment circuit, an inverter, a first PMOS transistor, a second PMOS transistor, a first NMOS transistor, and a second NMOS transistor. The voltage adjustment circuit is configured for receiving a first voltage and a second voltage and for generating an adjustment voltage. When the first voltage is higher than the second voltage, the adjustment voltage is substantially equal to the first voltage, and when the first voltage is lower than the second voltage, the adjustment voltage is substantially equal to the second voltage.

The voltage level shifter comprises the inverter configured for receiving an input signal and for operating at the adjustment voltage. The voltage level shifter comprises the first PMOS transistor having a gate connected to an output terminal of the inverter, a drain connected to the output signal, and a source connected to the first voltage. The voltage level shifter comprises the second PMOS transistor having a gate connected to a reference voltage, and having a source connected to the output terminal of the inverter. The voltage level shifter comprises the first NMOS transistor having a gate connected to the output signal, a drain connected to a drain of the second PMOS transistor, and a source connected to the reference voltage. The voltage level shifter comprises the second NMOS transistor having a gate connected to the drain of the second PMOS transistor, a drain connected to the output signal, and a source connected to the reference voltage.

BRIEF DESCRIPTION OF THE DRAWINGS

The invention will be described according to the appended drawings in which.

DETAILED DESCRIPTION OF THE INVENTION

Figure 4:
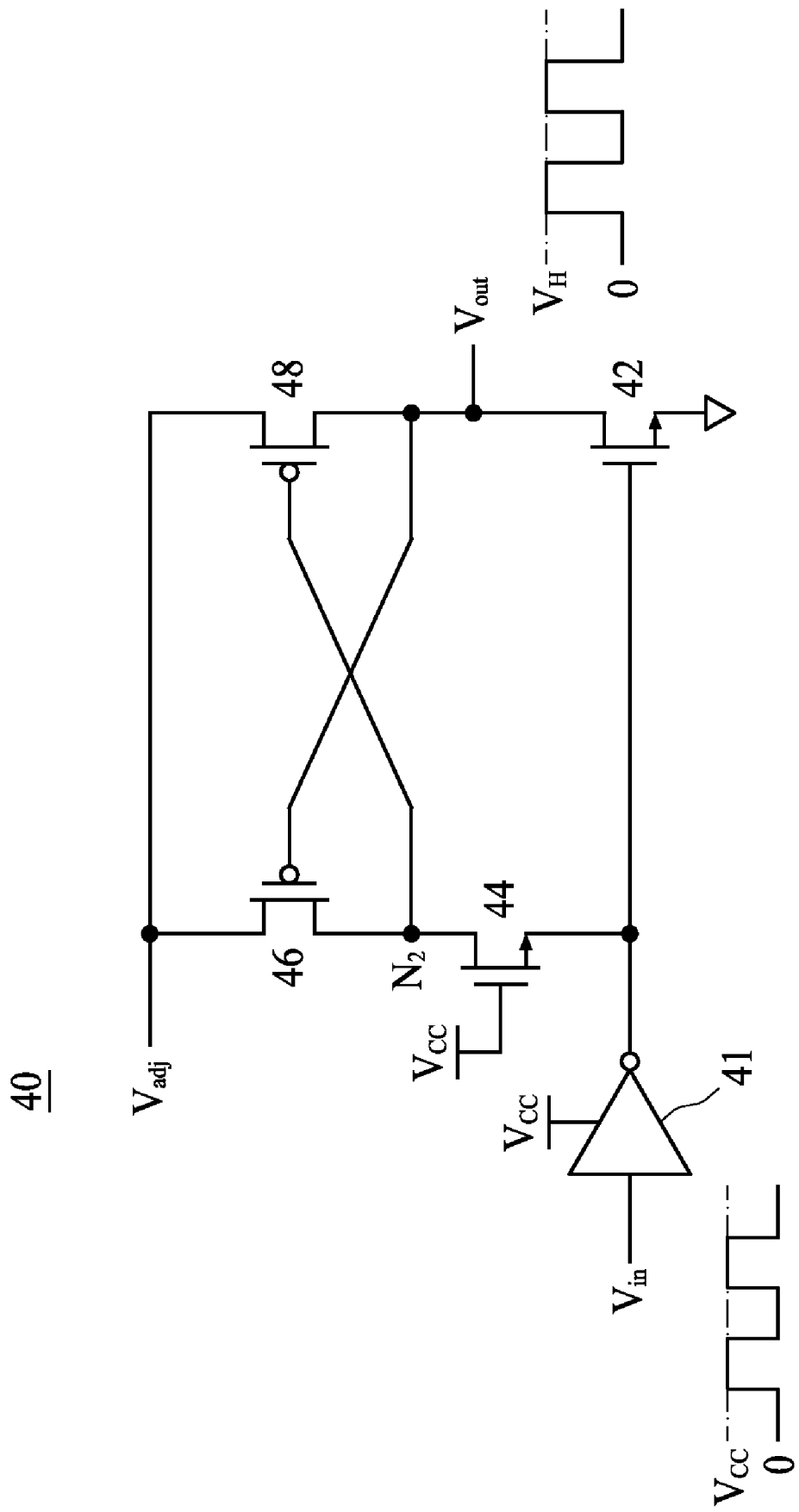
FIG. 4 shows a block diagram of a high level shifter according to one embodiment of the present invention.
Figure 5:
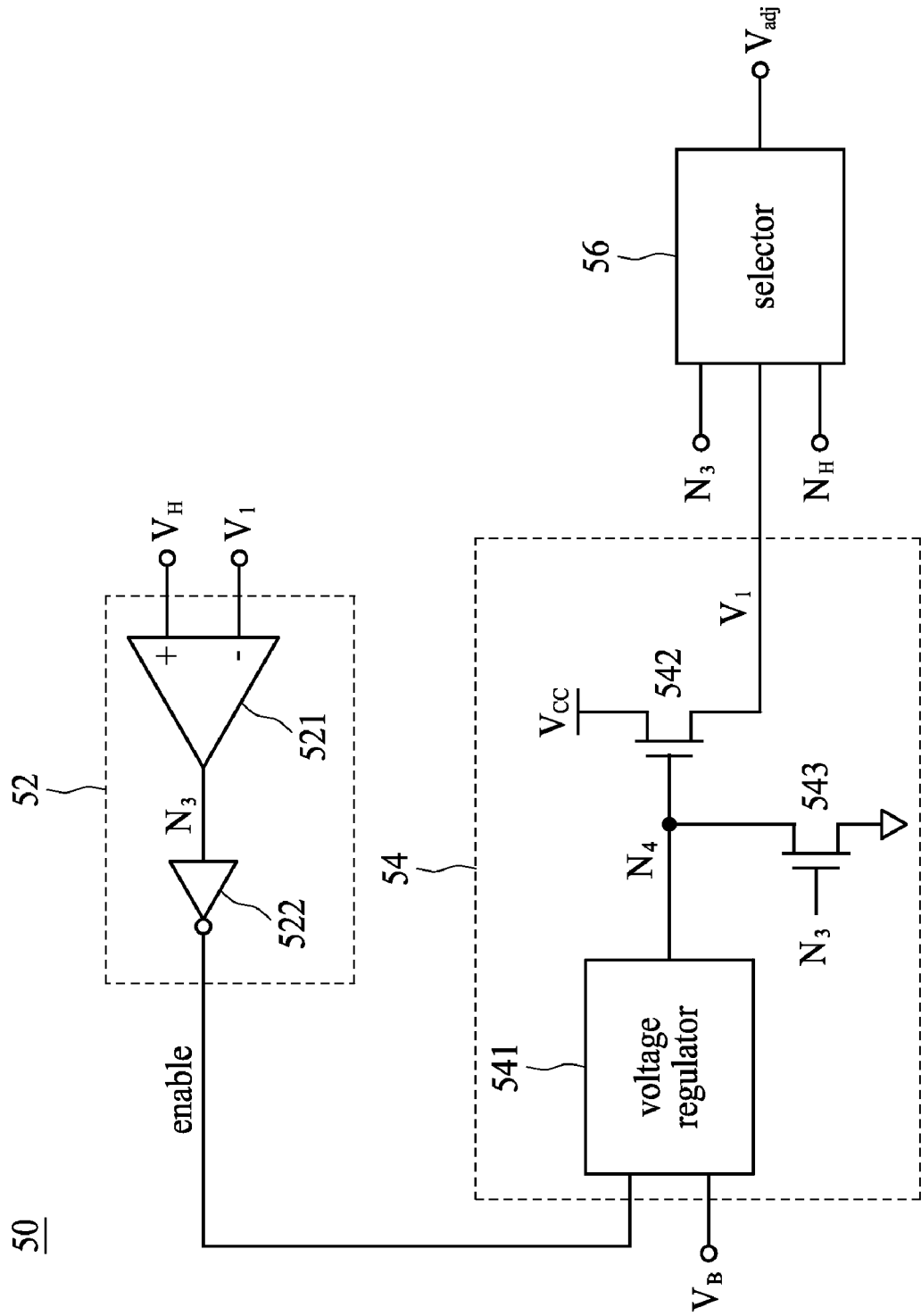
FIG. 5 shows a block diagram of the voltage adjustment circuit according to one embodiment of the present invention.

FIG. 4 shows a block diagram of a high level shifter 40 according to one embodiment of the present invention. The level shifter 40 receives an input signal $V_{in}$ which has two voltage levels $V_{CC}$ and GND, and outputs an output signal $V_{out}$ which has two voltage levels $V_{adj}$ and GND, where $V_{adj}$ is provided by a voltage adjustment circuit 50 as shown in FIG. 5. The level shifter 40 comprises an inverter 41, a first NMOS transistor 42, a second NMOS transistor 44, a first PMOS transistor 46, and a second PMOS transistor 48.

Referring to FIG. 4, the inverter 41 is configured for receiving the input signal $V_{in}$ and is operated at a first voltage VCC. The first NMOS transistor 42 includes a gate connected to an output terminal of the inverter 41, a drain connected to the output signal $V_{out}$, and a source connected to GND. The second NMOS transistor 44 has a gate connected to the first voltage VCC and a source connected to the output terminal of the inverter 41. The first PMOS transistor 46 has a gate connected to the output signal $V_{out}$, a drain connected to a drain of the second NMOS transistor 44, and a source connected to the adjustment voltage $V_{adj}$. The second PMOS transistor 48 has a gate connected to the drain of the second NMOS transistor 44, a drain connected to the output signal $V_{out}$, and a source connected to the adjustment voltage $V_{adj}$.

FIG. 5 shows a block diagram of the voltage adjustment circuit 50 according to one embodiment of the present invention. The voltage adjustment circuit 50 is configured for receiving the first voltage $V_{CC}$ and a second voltage $V_H$ and for generating the adjustment voltage $V_{adj}$. When the first voltage $V_{CC}$ is higher than the second voltage $V_H$, the adjustment voltage $V_{adj}$ is substantially equal to the first voltage $V_{CC}$, and when the first voltage $V_{CC}$ is lower than the second voltage $V_H$, the adjustment voltage $V_{adj}$ is substantially equal to the second voltage $V_H$.

Referring to FIG. 5, the voltage adjustment circuit 50 comprises a voltage generator 54, a comparing circuit 52 and a selector 56. The voltage generator 54 is configured for receiving the first voltage $V_{CC}$ and for generating a first output signal $V_1$ according to an enable signal. The comparing circuit 52 is configured for comparing the first output signal $V_1$ with the second voltage $V_H$ and for generating the enable signal. The selector 56 is configured for receiving the first output signal $V_1$ and the second voltage $V_H$ and for generating the adjustment voltage $V_{adj}$ according to the inverted enable signal at node $N_3$.

In FIG. 5, the comparing circuit 52 comprises a comparator 521 configured for generating a voltage at node $N_3$ and an inverter 522 configured for generating the enable signal. The voltage at node $N_3$ and the enable signal are approximately 180 degrees out of phase with each other. The voltage generator 54 comprises a voltage regulator 541, a first NMOS transistor 542 and a second NMOS transistor 543. In one embodiment, the voltage regulator 541 may be a step-up voltage converter. In another embodiment, the voltage regulator 541 may be a charge pump. The voltage regulator 541 is used for receiving a bias voltage $V_B$ and for generating a voltage at node $N_4$ according to the enable signal.

In one embodiment, the voltage generator 54 comprises the first NMOS transistor 542 having a gate connected to the node $N_4$, a drain connected to the first voltage $V_{CC}$, and a source configured for generating the first output signal $V_1$. In another embodiment, the voltage generator 54 further comprises the second NMOS transistor 543 having a gate connected to the node $N_3$, a drain connected to the node $N_4$, and a source connected to GND.

Figure 6:
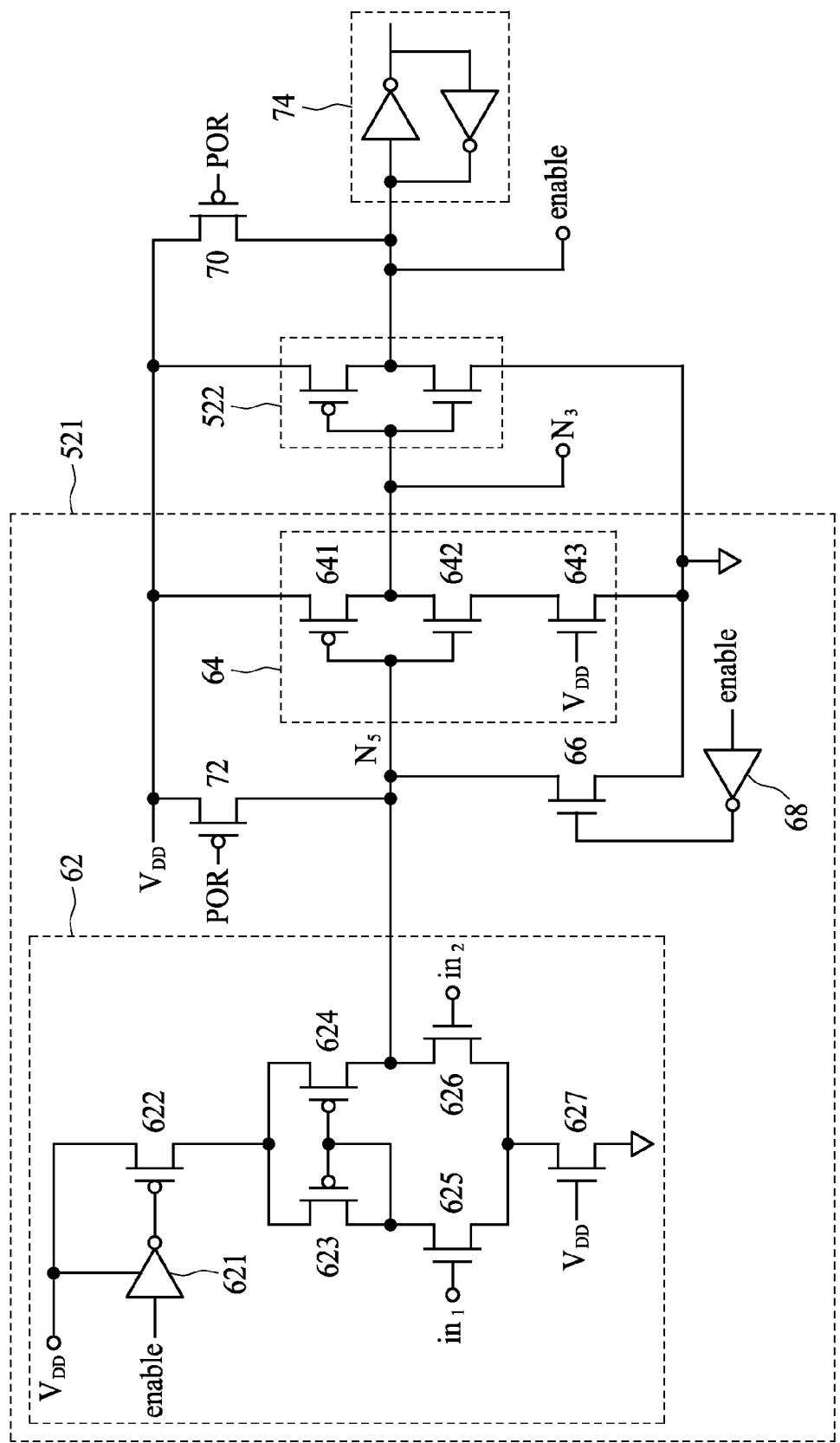
FIG. 6 shows a more detailed block diagram of a portion of the level shifter according to one embodiment of the present invention.

FIG. 6 shows a more detailed block diagram of a portion of the level shifter 40 according to one embodiment of the present invention. The portion of the level shifter 40 is supplied by a regulated voltage $V_{DD}$. In one embodiment, the regulated voltage $V_{DD}$ is the second voltage $V_H$. The comparator 521 comprises a first stage 62 and a second stage 64. The first stage 62 is a differential stage and consists of a differential pair of transistors 625 and 626, each having a gate, a source and a drain. The gates of the transistors 625 and 626 are connected to input terminals $in_1$ and $in_2$ respectively of the first stage 62. A transistor 627 is connected to the sources of the transistors 625 and 626. A current mirror formed by transistors 623 and 624 is connected to the drains of the transistors 625 and 626, respectively, to generate a single-ended output $N_5$ of the first stage 62. A transistor 622 is connected to the sources of the transistors 623 and 624 and a gate of the transistor 622 is connected to an inverted enable signal. The second stage 64 is an inverting stage and comprises transistors 641, 642, and 643, each having a source, a gate and a drain. The transistor 643 is used for compensating the variation of the regulated voltage $V_{DD}$. The second stage 64 generates a voltage at node $N_3$, which is applied to the input terminal of the inverter 522, as shown in FIG. 5.

Referring to FIG. 5 and FIG. 6, the input terminals $in_1$ and $in_2$ are connected to the first output signal $V_1$ and the second voltage $V_H$, respectively. Since the second voltage $V_H$ is generated by a charge pump, or a voltage regulator (not shown) in a chip, it may rise slowly from 0 to the final desired voltage level. When the second voltage $V_H$ is lower than the first output signal $V_1$, the output terminal $N_3$ of the comparator 521 goes low, while the enable signal goes high. Therefore the voltage regulator 541 is activated and the voltage at node $N_4$ is increased. Accordingly, the first NMOS transistor 542 is turned on. When the first NMOS transistor 542 is turned on, the first output signal $V_1$ is generated and is substantially equal to the first voltage VCC. Meanwhile, the selector 56 selects the first output signal $V_1$ as the adjustment voltage $V_{adj}$ according to the low level of the voltage at node $N_3$.

Alternatively, when the second voltage $V_H$ is higher than the first output signal $V_1$, the output terminal $N_3$ of the comparator 521 goes high, while the enable signal goes low. Therefore, the voltage regulator 541 is non-activated. When the output terminal $N_3$ of the comparator 521 goes high, the transistor 543 is turned on, pulling the voltage at node $N_4$ low.

Therefore the first NMOS transistor 542 is turned off. Meanwhile, the selector 56 selects the second voltage $V_H$ as the adjustment voltage $V_{adj}$ according to the high level of the voltage at node $N_3$.

Figure 1:
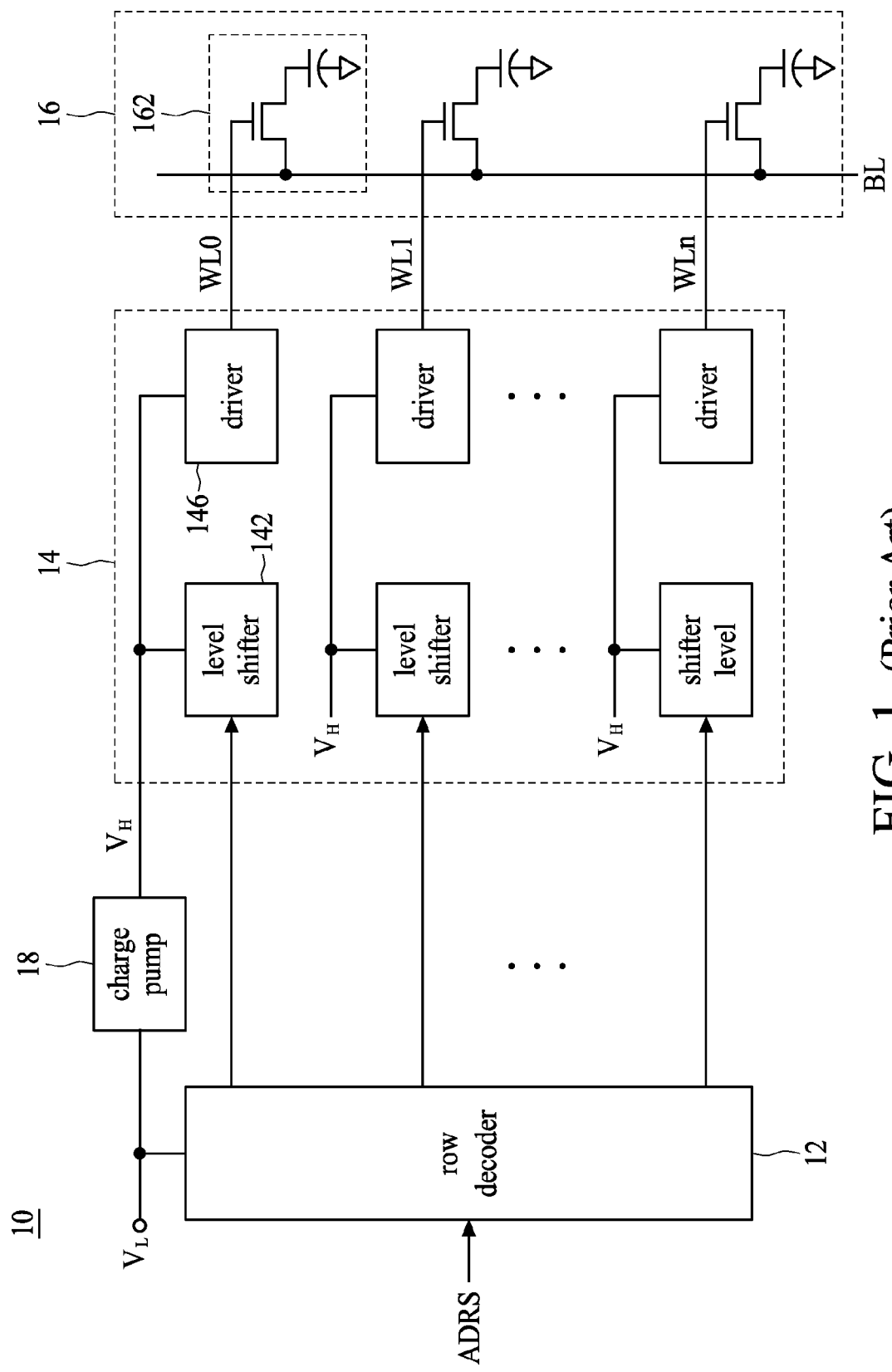
FIG. 1 shows a portion of a conventional memory device.
Figure 2:
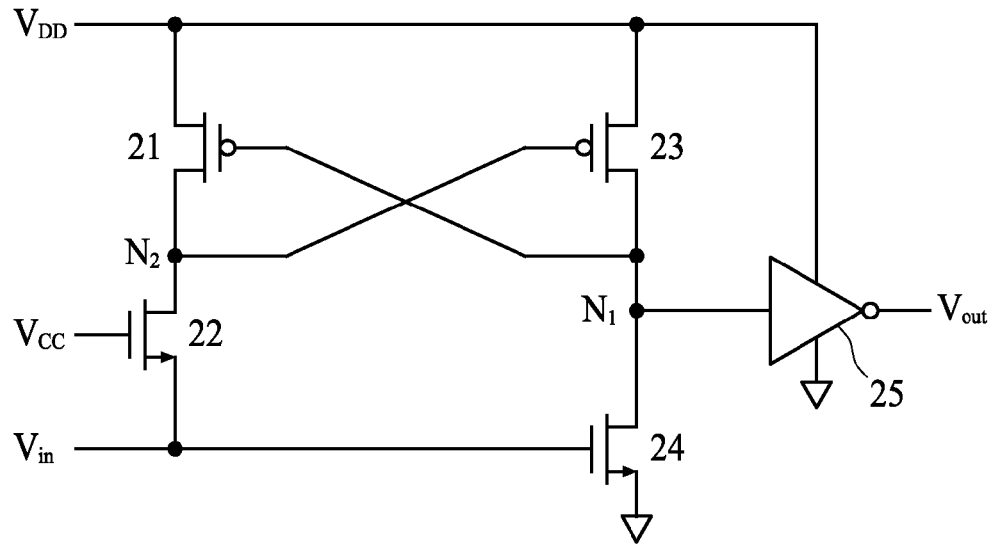
FIG. 2 shows a block diagram of a conventional high-level shifter.

Now referring to FIG. 2 and FIG. 4, the above-mentioned deficiency of the high level shifter 20 in the prior art can be solved by replacing a supply voltage of the first and second transistor 46 and 48 with the adjustment voltage $V_{adj}$, which is substantially equal to the first voltage $V_{CC}$ when the first voltage $V_{CC}$ is higher than the second voltage $V_H$, and is substantially equal to the second voltage $V_H$ when the second voltage $V_H$ is higher than the first voltage $V_{CC}$. In this way, since the drain signal of the first PMOS transistor 46 is always lower than the adjustment voltage $V_{adj}$, a parasitic PN junction between the $P^+$ drain and N-well of the first PMOS transistor 46 never turns on.

Figure 7:
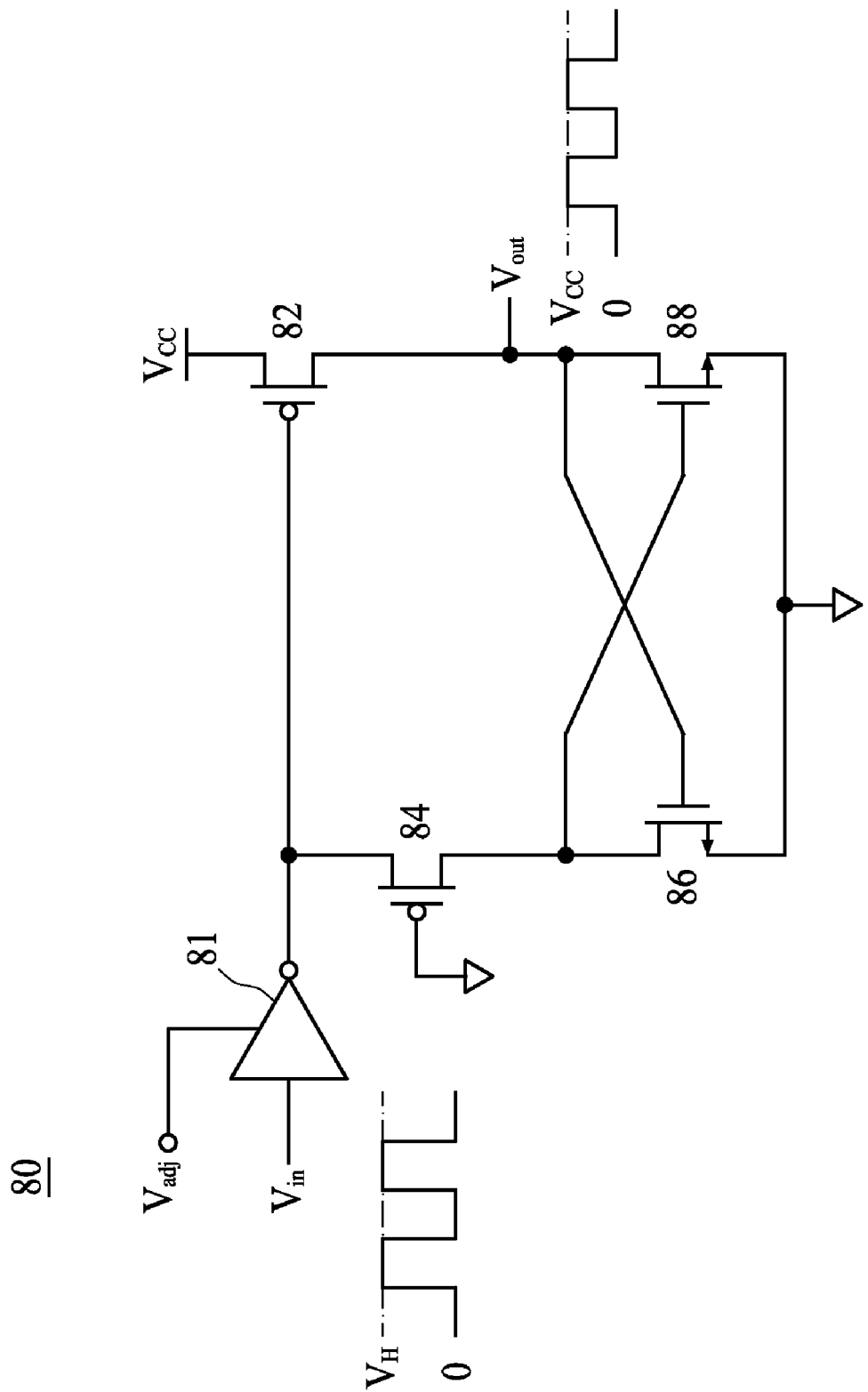
FIG. 7 shows a block diagram of a low level shifter according to one embodiment of the present invention.

FIG. 7 shows a block diagram of a low level shifter 80 according to one embodiment of the present invention. The level shifter 80 receives an input signal $V_{in}$ which has two voltage levels $V_H$ and GND, and generates an output signal $V_{out}$ which has two voltage levels $V_{CC}$ and GND. An inverter 81 is configured for receiving the input signal $V_{in}$ and operated at the voltage $V_{adj}$, where $V_{adj}$ is provided by the voltage adjustment circuit 50 as shown in FIG. 5. The level shifter 80 further comprises a first PMOS transistor 82, a second PMOS transistor 84, a first NMOS transistor 86, and a second NMOS transistor 88.

Referring to FIG. 7, the first PMOS transistor 82 has a gate connected to an output terminal of the inverter 81, a drain connected to the output signal $V_{out}$, and a source connected to the first voltage $V_{CC}$. The second PMOS transistor 84 has a gate connected to GND and a source connected to the output terminal of the inverter 81. The first NMOS transistor 86 has a gate connected to the output signal $V_{out}$, a drain connected to a drain of the second PMOS transistor 84, and a source connected to GND. The second NMOS transistor 88 has a gate connected to the drain of the second PMOS transistor 84, a drain connected to the output signal $V_{out}$, and a source connected to GND.

Figure 3:
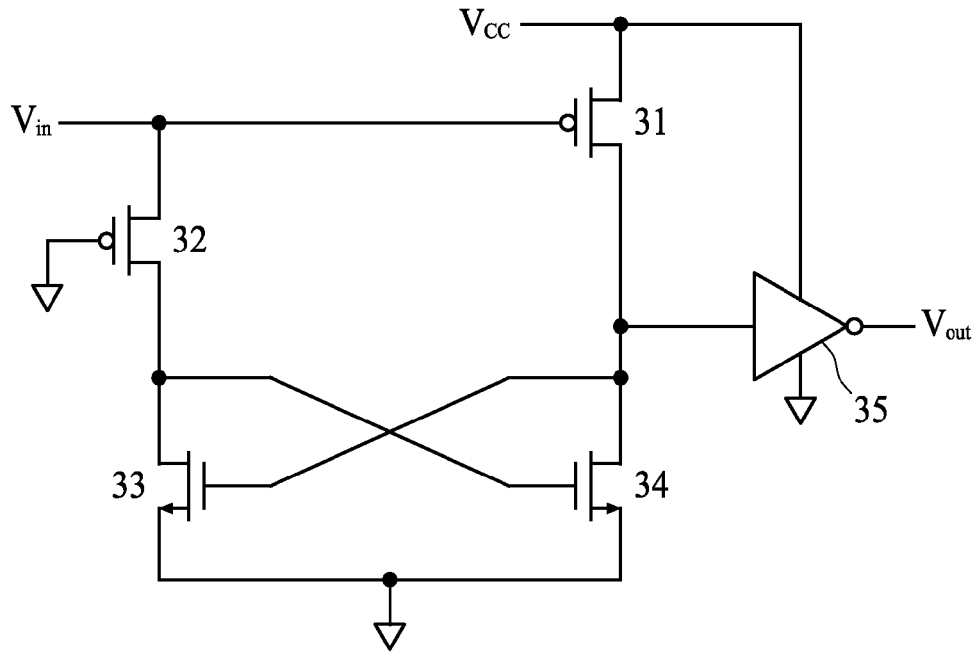
FIG. 3 shows a block diagram of a conventional low-level shifter.

Similarly, referring to FIG. 3 and FIG. 7, the above-mentioned problem of the low level shifter 30 in the prior art can be solved by replacing the supply voltage of the inverter 81 with the adjustment voltage $V_{adj}$, which is substantially equal to the first voltage $V_{CC}$ when the first voltage $V_{CC}$ is higher than the second voltage $V_H$, and is substantially equal to the second voltage $V_H$ when the first voltage $V_{CC}$ is lower than the second voltage $V_H$. In this way, since the high level of the output signal of the inverter 81 is always equal to the adjustment voltage $V_{adj}$, the first PMOS transistor 82 and the second NMOS transistor 88 never turn on at the same time.

While preferred embodiments are disclosed herein, many variations are possible which remain within the concept and scope of the invention. For example, although FIG. 4 shows a block diagram of the high level shifter 40 according to one embodiment of the present invention, and FIG. 7 shows a block diagram of the low level shifter 80 according to one embodiment of the present invention, other types of level shifters may be used by replacing a supply voltage with an adjustment voltage in operation. Such modification may become clear to one of ordinary skill in the art after inspection of the specification, drawings and claims herein.

Referring to FIG. 6, the comparator 521 comprises transistors 70 and 72 for improving performance during a power-up sequence of the regulated voltage $V_{DD}$. When the voltage $V_{DD}$ rises from 0 to a predetermined value, a POR signal goes low so that transistors 70 and 72 are turned on. Accordingly, the voltage at node $N_3$ goes low and the enable signal goes high so that the selector 56 selects the first output signal $V_1$ as the adjustment voltage $V_{adj}$. In addition, when the second voltage $V_H$ is higher than the first output signal $V_1$, the comparator 521 enters a power-saving mode for reducing power consumption. At this time, the transistor 622 is turned off via an inverter 621 for reducing standby current of the comparator 521, and the transistor 66 is turned on via an inverter 68 for pulling a voltage of node $N_5$ down. A latch circuit 74 is also used to latch the enable signal being low. In addition, when the enable signal is low, the voltage regulator 541 is non-activated for reducing power consumption.

The above-described embodiments of the present invention are intended to be illustrative only. Numerous alternative embodiments may be devised by those skilled in the art without departing from the scope of the following claims.

What is claimed is:

1. A voltage level shifter, comprising:
 a voltage adjustment circuit configured for receiving a first voltage and a second voltage and for generating an adjustment voltage;
 an inverter configured for receiving an input signal and for operating at the first voltage;
 a first NMOS transistor having a gate connected to an output terminal of the inverter, a drain connected to an output signal, and a source connected to a reference voltage;
 a second NMOS transistor having a gate connected to the first voltage and a source connected to the output terminal of the inverter;
 a first PMOS transistor having a gate connected to the output signal, a drain connected to a drain of the second NMOS transistor, and a source connected to the adjustment voltage; and
 a second PMOS transistor having a gate connected to the drain of the second NMOS transistor, a drain connected to the output signal, and a source connected to the adjustment voltage;
 wherein when the first voltage is higher than the second voltage, the adjustment voltage is substantially equal to the first voltage, and when the first voltage is lower than the second voltage, the adjustment voltage is substantially equal to the second voltage.

2. The voltage level shifter of claim 1, wherein the voltage adjustment circuit comprises:
 a voltage generator configured for receiving the first voltage and for generating a first output signal according to an enable signal;
 a comparing circuit configured for comparing the first output signal with the second voltage and for generating the enable signal and an inverted enable signal; and
 a selector configured for receiving the first output signal and the second voltage and for generating the adjustment voltage according to the inverted enable signal.

3. The voltage level shifter of claim 2, wherein the voltage generator comprises:
 a voltage regulator configured for receiving the enable signal; and
 a first NMOS transistor having a gate connected to an output terminal of the voltage regulator, a drain connected to the first voltage, and a source configured for generating the first output signal.

4. The voltage level shifter of claim 3, wherein the voltage generator further comprises a second NMOS transistor, the second NMOS transistor has a gate connected to the inverted enable signal, a drain connected to the gate of the first NMOS transistor, and a source connected to the reference voltage.

5. The voltage level shifter of claim 3, wherein the voltage regulator is a step-up voltage converter or a charge pump.

6. The voltage level shifter of claim 3, wherein the voltage regulator is non-activated when the second voltage is higher than the first output signal.

7. The voltage level shifter of claim 2, wherein the comparing circuit is non-activated when the second voltage is higher than the first output signal.

8. The voltage level shifter of claim 2, wherein the comparing circuit further comprises a pull-up unit configured for receiving a power-up signal and for generating the enable signal according to the power-up signal.

9. The voltage level shifter of claim 8, wherein the pull-up unit is a PMOS transistor.

10. A voltage level shifter, comprising:
   a voltage adjustment circuit configured for receiving a first voltage and a second voltage and for generating an adjustment voltage;
   an inverter configured for receiving an input signal and for operating at the adjustment voltage;
   a first PMOS transistor having a gate connected to an output terminal of the inverter, a drain connected to the output signal, and a source connected to the first voltage;
   a second PMOS transistor having a gate connected to a reference voltage and a source to the output terminal of the inverter;
   a first NMOS transistor having a gate connected to the output signal, a drain connected to a drain of the second PMOS transistor, and a source connected to the reference voltage; and
   a second NMOS transistor having a gate connected to the drain of the second PMOS transistor, a drain connected to the output signal, and a source connected to the reference voltage;
   wherein when the first voltage is higher than the second voltage, the adjustment voltage is substantially equal to the first voltage, and when the first voltage is lower than the second voltage, the adjustment voltage is substantially equal to the second voltage.

11. The voltage level shifter of claim 10, wherein the voltage adjustment circuit comprises:
   a voltage generator configured for receiving the first voltage and for generating a first output signal according to an enable signal;
   a comparing circuit configured for comparing the first output signal with the second voltage and for generating the enable signal and an inverted enable signal; and
   a selector configured for receiving the first output signal and the second voltage and for generating the adjustment voltage according to the inverted enable signal.

12. The voltage level shifter of claim 11, wherein the voltage generator comprises:
   a voltage regulator configured for receiving the enable signal; and
   a first NMOS transistor having a gate connected to an output terminal of the voltage generator, a drain connected to the first voltage and a source, configured for generating the first output signal.

13. The voltage level shifter of claim 12, wherein the voltage generator further comprises a second NMOS transistor, the second NMOS transistor has a gate connected to the inverted enable signal, a drain connected to the gate of the first NMOS transistor, and a source connected to the reference voltage.

14. The voltage level shifter of claim 12, wherein the voltage regulator is a step-up voltage converter or a charge pump.

15. The voltage level shifter of claim 12, wherein the voltage regulator is non-activated when the second voltage is higher than the first output signal.

16. The voltage level shifter of claim 11, wherein the comparing circuit is non-activated when the second voltage is higher than the first output signal.

17. The voltage level shifter of claim 11, wherein the comparing circuit further comprises a pull-up unit configured for receiving a power-up signal and for generating the enable signal according to the power-up signal.

18. The voltage level shifter of claim 17, wherein the pull-up unit is a PMOS transistor.

* * * * *